United States Patent [19]
Kula et al.

[11] Patent Number: 5,306,166
[45] Date of Patent: Apr. 26, 1994

[54] CHIP STORAGE INSERTION GUIDE

[75] Inventors: Frank Kula, Pleasanton; Luis Arreola, San Jose, both of Calif.

[73] Assignee: Wyse Technology, Inc., San Jose, Calif.

[21] Appl. No.: 990,494

[22] Filed: Dec. 14, 1992

[51] Int. Cl.$^5$ .............................................. H01R 13/00
[52] U.S. Cl. ..................................................... 439/160
[58] Field of Search ................................ 439/152-160

[56] References Cited

U.S. PATENT DOCUMENTS 4,480,885 11/1984 Coppelman ......................... 439/159
5,057,029 10/1991 Noorily ................................ 439/157

FOREIGN PATENT DOCUMENTS 137782 9/1979 Fed. Rep. of Germany ...... 439/160

Primary Examiner—Joseph H. McGlynn
Attorney, Agent, or Firm—Janet Kaiser Castaneda; James E. Eakin

[57] ABSTRACT

A chip storage and insertion guide includes a generally rectangular plastic housing with a top wall, side walls and end walls. The end walls define guide posts for insertion into matching apertures in a printed circuit board. The side walls are configured so that the pins of a new chip are bent inwardly slightly as the chip is gently forced into the rectangular guide until it is flush against the inside of the top wall. A handle portion of a pivoted arm mechanism extends transversely across the top wall at each end of the housing. Pivot arms at each end of the handle extend down the side walls and are attached thereto with pegs pivotally engaged in notches formed in the side walls. When the two arm mechanisms are pivoted outwardly, a shoulder portion of each arm moves upwardly to align a camming surface with the lower edge of the side walls thereby enabling the chip to be inserted in the socket of the printed circuit board. When the two arm mechanisms are pivoted inwardly, the camming surfaces move downwardly below the lower edge of the side walls to either disengage a mounted chip, or to prevent insertion of the chip until the posts are properly inserted in the apertures in the circuit board. The handle portions enable the user to easily grasp and manipulate the chip insertion guide.

12 Claims, 4 Drawing Sheets

CHIP STORAGE INSERTION GUIDE

FIELD OF THE INVENTION

The present invention relates to a chip insertion guide, more particularly to an alignment and insertion guide for storing and installing an erasable programmable read-only memory (EPROM) chip in an electronic computing device.

BACKGROUND OF THE INVENTION

Dual in-line package (DIP) chips, which include EPROM chips, typically are factory installed in electronic devices, such as computers or computer peripherals. Installation of an DIP chip requires care to avoid damage to the chip and to the bendable mounting pins which generally are arrayed in two parallel rows, one on each side, as found in an EPROM chip. To correctly install a new EPROM chip on, for instance, a printed circuit board, the mounting pins are first checked for alignment; second, any non-aligned pins are gently bent into alignment; and, third, the two rows of outwardly extending pins typically are bent inward slightly to facilitate insertion of the pins into the appropriate socket on the printed circuit board.

Factory installation techniques are designed to avoid damage to the delicate pins. Additionally, the correct orientation of the chip on the board is shown generally by including a notch at one end of the chip and a mating notch at one end of the socket. Recently, computer components with user replaceable EPROM or other chips have appeared on the market. This has the distinct advantage of permitting field upgrade to the computer component; and, in many cases, a user can perform the upgrade. However, installation by the unsophisticated may damage the chip, or damage or break the pins. A heretofore unsolved need exists for a uncomplicated and inexpensive guide to enable an average computer user to install a computer chip without damage thereto.

SUMMARY OF THE INVENTION WITH OBJECTS

A general object of the invention is to provide an insertion guide for a computer chip that overcomes limitations and drawback of the prior art.

A specific object of the invention is to provide an insertion guide for a computer chip that automatically aligns and bends the pins slightly inwardly prior to serving as an insertion guide to install the chip in a socket on a printed circuit board.

Another specific object of the invention is to provide an inexpensive, simple chip insertion guide that enables the chip to be stored in the guide and protected thereby prior to marketing and/or installation on a circuit board. Additionally, the guide may be left on the installed chip.

One more specific object of the invention is to provide a chip insertion guide for an EPROM chip.

A chip insertion guide embodying the principles of the present invention includes a generally rectangular plastic housing with a top wall, side walls and end walls. The end walls define guide posts for insertion into matching apertures in a printed circuit board. The side walls are configured so that the outwardly bent pins of a new chip are bent inwardly slightly as the chip is gently forced into the rectangular guide until it is flush against the inside of the top wall. A handle portion of a pivoted arm mechanism extends transversely across the top wall at each end of the housing. Pivot arms at each end of the handle extend down the side walls and are attached thereto with pegs pivotally engaged in notches formed in the side walls. When the two arm mechanisms are pivoted outwardly, a shoulder portion of each arm moves upwardly to align with the lower edge of the side walls thereby enabling the chip to be inserted in the socket of the printed circuit board. When the two arm mechanisms are pivoted inwardly, a camming surface of the shoulder portions moves downwardly below the lower edge of the side walls to either disengage a mounted chip, or to prevent insertion of the chip until the posts are properly inserted in the apertures in the circuit board. The handle portions enable the user to easily grasp and manipulate the chip insertion guide.

These and other objects, advantages and features of the present invention will become more apparent upon considering the following detailed description of a preferred embodiment, presented in conjunction with the accompanying drawings.

DESCRIPTION OF A PREFERRED EMBODIMENT

Figure 1:
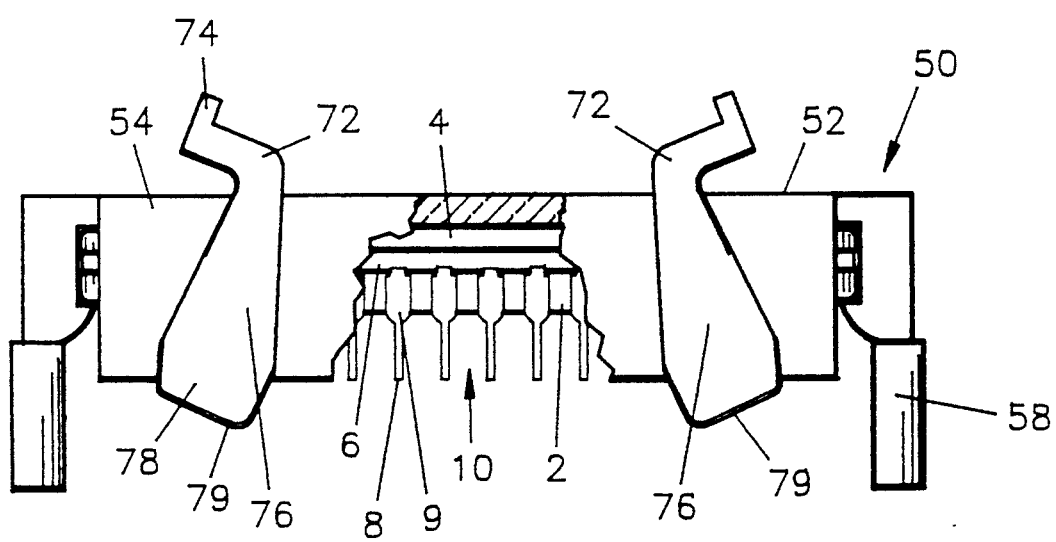
FIG. 1 is a side view of a chip insertion guide embodying the principles of the present invention and partially cut away to show a EPROM chip mounted therein. The arms are shown in the chip removal position.
Figure 3:
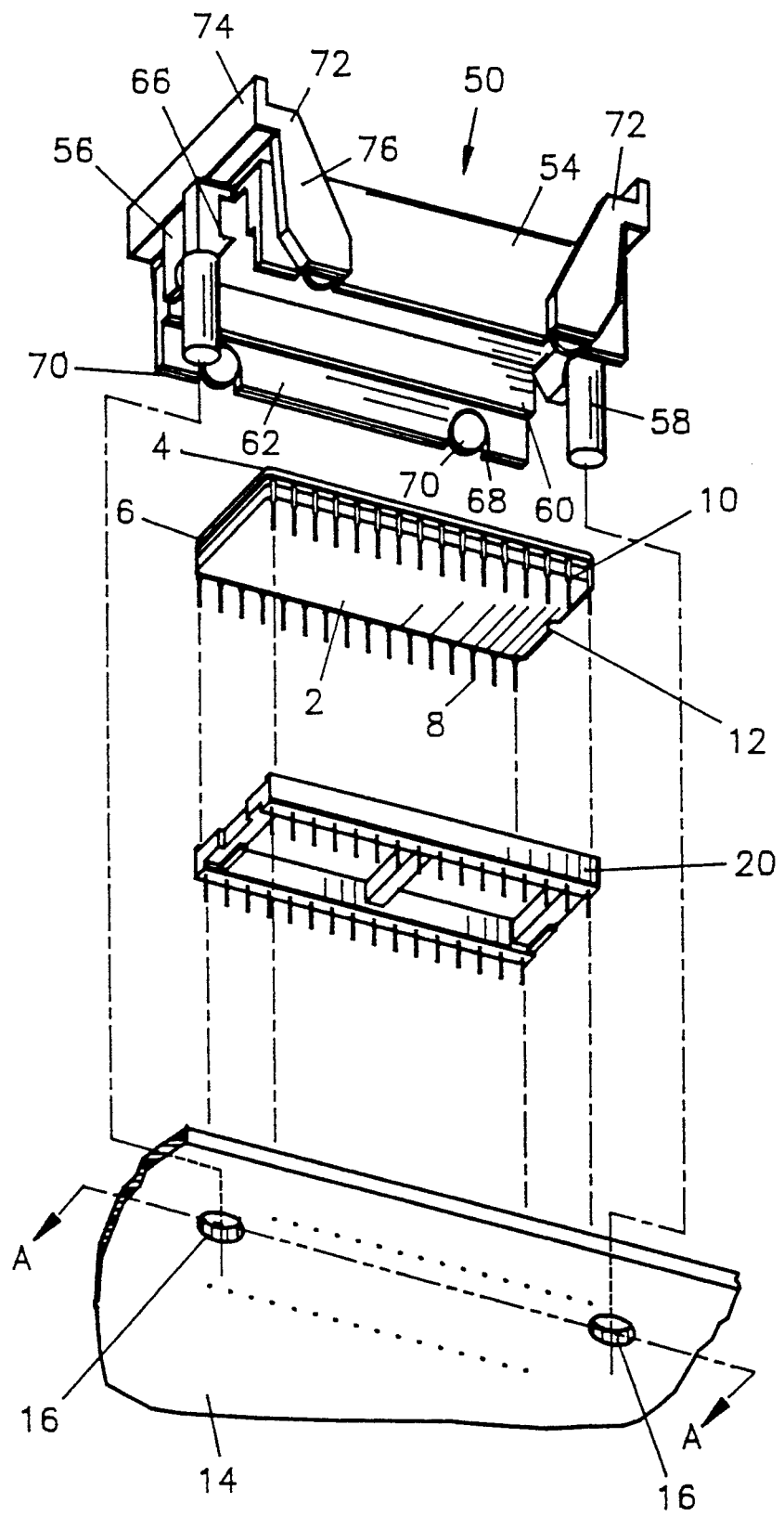
FIG. 3 is an exploded view of the chip insertion guide, the EPROM chip, the mounting socket, and a section of a printed circuit board. The arms are shown in the chip insertion position.

A chip insertion guide embodying the principles of the present invention is shown generally at 50 in FIGS. 1 and 3. In the illustrated embodiment, a chip guide is shown for an EPROM chip 10, but it will be recognized by those skilled in the art that the guide may be configured for use with any chip having lead pins for insertion into a socket.

Figure 2:
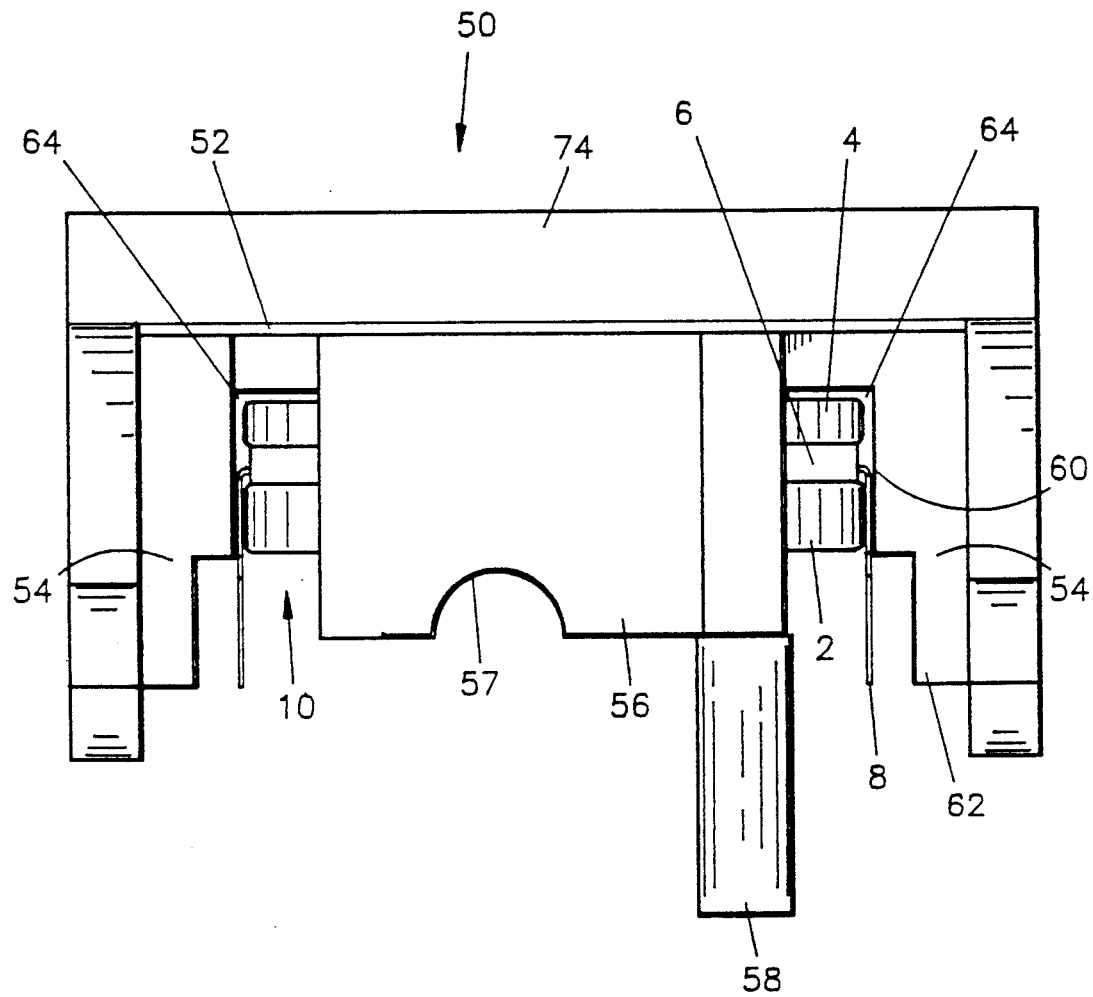
FIG. 2 is an end view of the chip insertion guide of FIG. 1.

As best shown in FIGS. 1, 2 and 3, the conventional DIP chip, such as the illustrated EPROM, is generally encased in a plastic or ceramic housing that includes a top layer 2, a base layer 4, and a middle layer 6 typically made of plastic or glass. A plurality of lead pins 8 extend outwardly from the package and typically are arrayed in parallel rows along the outside edge of both long sides of the generally rectangular EPROM chip 10. An orientation notch 12 may be formed at one end of the chip 10, as best shown in FIG. 3. A conventional chip socket 20 is mounted to a printed circuit board 14 in a manner well known in the art for receipt of the lead pins 8 of the EPROM.

The generally rectangular chip insertion guide 50 is preferably made from a clear plastic substance so that the chip 10 may be easily seen through the guide 50. Other suitable substances may be used, and the guide need not be transparent. The guide 50 defines a preferably one piece, molded plastic housing having a top planar surface 52, two side walls 54, and two end walls 56. The end walls 56 further define cylindrical mounting posts 58 for registration in mating apertures 16 in the circuit board 14.

As best seen in FIGS. 2 and 3, the side walls 54 are thicker at a top alignment portion 60. The top alignment portion 60 is sized so that, when a new chip 10 is inserted into the guide 50, the top alignment portion gently pushes against the shoulder 9 of the outwardly bent lead pins 8. The pressure exerted on the shoulder 9 by the alignment portion 60 causes the outwardly bent lead pins 8 to bend inwardly slightly thereby positioning the lead pins 8 for insertion into the socket 20.

The lower portion 62 of the side wall 54 is narrower than portion 60 to allow insertion of the lead pins 8 in the socket 20, and lower portion 62 is of a length sufficient to prevent exposure of the fragile ends of the lead pins 8 when the EPROM chip 10 is not installed on the circuit board 14.

Figure 4:
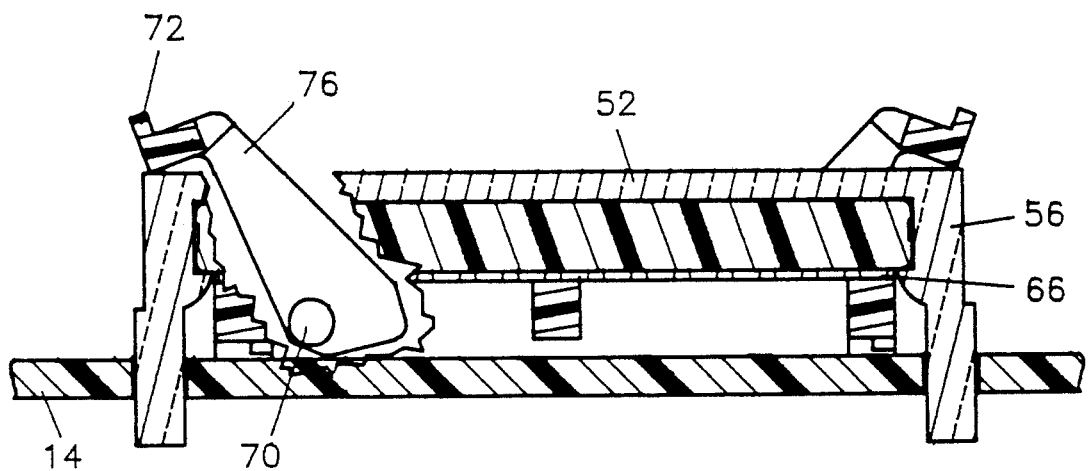
FIG. 4 is a sectional view of the chip insertion guide and EPROM chip showing the chip inserted in a socket attached to a printed circuit board. The view is partially cut away to show the insertion position of the arm mechanism.

As best shown in FIG. 2, the end walls 56 do not extend the full length of the EPROM chip 10 to enable exposure of and access to the chip 10 at two open recesses 64 in each end wall 56 of the chip alignment guide 50. In the embodiment shown, an optional notch 57 is defined in each end wall 56. As best shown in FIGS. 3 and 4, the inside surface of each end wall 56 preferably defines a narrow shelf 66 so that the chip 10 is effectively snap mounted and securely positioned within the guide 50.

Referring now to FIGS. 1 and 3, each lower edge of side wall 54 defines two pivot joints 68. Engaged for rotation within the pivot joints 68 are the pegs 70 of a pivot arm mechanism for facilitating chip insertion and removal. The pivot arm mechanism comprises a pair of arms 72, each arm defining a handle portion 74 which extends transversely across the top wall 52 of the guide 50 to allow the user to manipulate the assembled guide 50 and chip. A pivot arm 76 extends from each end of each handle portion 74 downwardly on the outside of each side wall 54. A peg 70 on each pivot arm 76 is attached for rotation within the pivot joint 68.

Each pivot arm 76 defines a shoulder portion 78 with a camming surface 79. When the arms 72 are pivoted toward each other and toward the center of the guide 50 as shown in FIG. 1, the shoulder portion 78 and camming surface 79 extend below the bottom edge of the side walls 54. As shown in FIGS. 3 and 4, when the arms 72 are pivoted away from each other and outwardly toward the ends of the guide 50, the camming surface 79 is substantially even with the bottom edge of the side walls 54.

To install a chip mounted within the chip alignment guide 50 as shown in FIG. 4, the user first aligns the posts 58 within the apertures 16. With the arms 72 in the insertion position shown in FIGS. 3 and 4, the posts 58 may be lowered into the apertures 16, and downward pressure may be applied to the handles 72 and top wall 52 of the guide 50 until the lead pins 8 are completed inserted in the socket 10. To remove the insertion guide 50 and the chip 10, the arms 72 are pivoted toward each other and inwardly thereby causing the camming surface 79 of the shoulder portion 78 to pivot below the side wall 54. As the camming surface 79 encounters the resisting surface of the circuit board 14, the insertion guide 50 and chip are pushed upwardly so that the lead pins 8 disengage from the socket 10. Alternatively, if it is desired to eliminate the arms 72 in the interests of space, a lever device may be inserted into the optional notch 57 to lift the guide 50 upwardly away from the socket 10.

It will be recognized by those skilled in the art that the chip insertion guide 50 is preferably left in place with the installed chip. Alternatively, the guide 50 may be made from a flexible material so that the chip, installed or not installed on a circuit board, may be removed from the guide. The flexible material must be of a rigidity sufficient to permit insertion and removal of the chip from a socket, yet exhibit a flexibility sufficient to allow the chip to be removed from the guide.

To those skilled in the art to which the present invention pertains, many widely varying embodiments and implementations of the principles of the present invention will be suggested from the foregoing. For instance, the guide may be shaped and sized for the majority of DIP chips having pins for insertion into a socket device. The device may be adapted for PGA chips having sufficient gripping areas at the corners thereof. Additionally, alignment posts may be omitted if desired, or when alignment apertures are not provided, and the lever arms may be omitted as described above. The description and the disclosures present herein are by way of illustration only and should not be considered to limit the present invention, the scope of which is more particularly set forth in the following claims.

What is claimed is:

1. A storage and insertion guide for a computer chip of the type having a plurality of lead pins for engagement within a socket, the insertion guide comprising:
a housing defining a chamber formed by a top wall, end and side walls, the side walls having means for aligning the lead pins when the computer chip is placed within the chamber and sized to shield the lead pins when the computer chip is stored within the chamber, the housing further defining means for disengaging the lead pins from the socket when the computer chip is engaged within a socket.

2. The insertion guide of claim 1 wherein the means for disengaging the lead pins from the socket when the computer chip is engaged within a socket is a notch defined in the housing for inserting a device to lever the housing and attached computer chip upwardly away from the socket.

3. The insertion guide of claim 1 further comprising registration means defined in the housing means for alignment of the housing means at the socket.

4. The insertion guide of claim 3 wherein the means for disengaging the lead pins from the socket when the computer chip is engaged within a socket is a pivot arm mechanism and having a first operating position for enabling engagement of the lead pins in the socket and a second operating position for disengaging the lead pins from the socket.

5. The insertion guide of claim 4 wherein, in the first operating position, a camming mechanism of the pivot arm mechanism is positioned substantially flush with the lower edge of the side walls enabling engagement of the lead pins in the socket, and in the second operating position, the camming mechanism is extended beyond the lower edge of the side walls causing the camming mechanism to release the lead pins from the socket.

6. The insertion guide of claim 5 wherein the registration means is at least one post for engagement within at least one alignment aperture in a circuit board.

7. The insertion guide of claim 6 wherein the side walls are thicker near the top wall for pressing against a shoulder portion of the lead pins to align the lead pins.

8. The insertion guide of claim 7 wherein the housing means defines end walls having snap mounting means for securing the chip within the housing means.

9. The insertion guide of claim 8 wherein the pivot arm mechanism further defines a handle means for grasping and manipulating the guide.

10. The insertion guide of claim 9 wherein the housing is molded in one piece from a clear plastic material.

11. The insertion guide of claim 10 wherein side walls define pivot mount means for attaching the pivot arm mechanism.

12. A storage and insertion guide for a computer chip having a plurality of lead pins for engagement within a socket, the insertion guide comprising:

a housing means defining a space for carrying the computer chip and having side walls shielding the computer chip when stored in the housing means, the side walls further defining means for aligning the lead pins when the computer chip is inserted into the space;

registration means defined in the housing means for alignment of the housing means at the socket; and an arm mechanism means pivotally attached to the housing means for enabling engagement of the lead pins in the socket in a first operating position, pivoting the arm mechanism means to a second operating position causing a camming mechanism to disengage the lead pins from the socket.

* * * * *